(12) United States Patent
Hsiao

(10) Patent No.: US 6,919,630 B2
(45) Date of Patent: Jul. 19, 2005

(54) SEMICONDUCTOR PACKAGE WITH HEAT SPREADER

(75) Inventor: Cheng-Hsu Hsiao, Taichung (TW)

(73) Assignee: Siliconware Precision Industries Co. Ltd. (TW)

( * ) Notice: Subject to any disclaimer, the term of this patent is extended or adjusted under 35 U.S.C. 154(b) by 0 days.

(21) Appl. No.: 10/437,557

(22) Filed: May 13, 2003

(65) Prior Publication Data

US 2004/0188831 A1 Sep. 30, 2004

(30) Foreign Application Priority Data

Mar. 27, 2003 (TW) ........................ 92106880 A

(51) Int. Cl.$^7$ .................. H01L 23/10; H01L 23/34
(52) U.S. Cl. .................. 257/706; 257/625; 257/675; 257/705; 257/707; 257/712; 257/713; 257/717; 257/720; 257/930
(58) Field of Search ................ 257/712–713, 257/717, 930, 625, 675, 705–707, 720

(56) References Cited

U.S. PATENT DOCUMENTS

| | | | | |
|---|---|---|---|---|
| 5,032,897 A | * | 7/1991 | Mansuria et al. | 257/701 |
| 5,289,337 A | * | 2/1994 | Aghazadeh et al. | 361/718 |
| 5,459,368 A | | 10/1995 | Onishi et al. | 310/313 |
| 5,637,920 A | | 6/1997 | Loo | 257/700 |
| 5,903,052 A | * | 5/1999 | Chen et al. | 257/706 |
| 6,093,960 A | * | 7/2000 | Tao et al. | 257/706 |
| 6,139,975 A | * | 10/2000 | Mawatari et al. | 428/600 |
| 6,225,695 B1 | * | 5/2001 | Chia et al. | 257/712 |
| 6,239,487 B1 | * | 5/2001 | Park et al. | 257/712 |
| 6,529,379 B1 | * | 3/2003 | Fuller et al. | 361/705 |
| 6,580,611 B1 | * | 6/2003 | Vandentop et al. | 361/704 |
| 6,773,963 B2 | * | 8/2004 | Houle | 438/122 |
| 2002/0053724 A1 | * | 5/2002 | Lai et al. | 257/679 |
| 2002/0053731 A1 | * | 5/2002 | Chao et al. | 257/706 |
| 2003/0164505 A1 | * | 9/2003 | Streubel et al. | 257/80 |
| 2003/0178721 A1 | * | 9/2003 | Lo et al. | 257/723 |
| 2004/0124525 A1 | * | 7/2004 | Colgan et al. | 257/712 |

FOREIGN PATENT DOCUMENTS

JP        10294403 A   * 11/1998   .......... H01L/23/29

* cited by examiner

*Primary Examiner*—Amir Zarabian
*Assistant Examiner*—Ida M. Soward
(74) *Attorney, Agent, or Firm*—Peter F. Corless; Steven M. Jensen; Edwards & Angell, LLP

(57) ABSTRACT

A semiconductor package with an embedded heat spreader (EHS) is proposed, which can be used for the fabrication of a semiconductor package, such as a FCBGA (Flip-Chip Ball Grid Array) package with a heat spreader, and which is characterized by the provision of a plurality of recessed portions, either in the heat spreader attach area of the substrate, or in the support portion of the heat spreader, or in both, so as to allow the fill-in portions of the adhesive layer that are filled in these recessed portions to form anchor structures to benefit the heat spreader against crosswise shear stress. Moreover, since the provision of these recessed portions allows an increase in the contact area of the adhesive layer with the substrate and the heat spreader, it can help increase the adhesive strength to provide the heat spreader more securely adhered in position on the substrate.

12 Claims, 6 Drawing Sheets

SEMICONDUCTOR PACKAGE WITH HEAT SPREADER

FIELD OF THE INVENTION

This invention is related to semiconductor package technology, and more particularly, to a semiconductor package with a heat spreader which can be used for the fabrication of a semiconductor package, such as a FCBGA (Flip-Chip Ball Grid Array) package with a heat spreader, allowing the heat spreader to be more securely adhered on a substrate.

BACKGROUND OF THE INVENTION

Ball Grid Array (BGA) is an advanced type of semiconductor packaging technology which is characterized by the use of a substrate whose front surface is mounted with one or more semiconductor dice and whose back surface is planted with an array of solder balls. During Surface Mount Technology (SMT) process, the BGA package is mechanically bonded and electrically coupled to an external printed circuit board via these solder balls.

Flip-Chip Ball Grid Array (FCBGA) is a more advanced type of BGA technology which is characterized by that the packaged semiconductor die is mounted in an upside-down manner (i.e., flip chip) over the substrate and bonded to the same by means of a plurality of solder bumps attached to the I/O pads thereon. FCBGA technology needs no wires to electrically connect the semiconductor die to the substrate, so as to minimize size of the BGA package.

FIG. 1 is a schematic diagram showing a cross-sectional view of a typical FCBGA-type of semiconductor package with heat spreader. As shown in FIG. 1, the FCBGA package is composed of: (a) a substrate 10; (b) at least one semiconductor die 20; (c) an adhesive layer 30; (d) a heat spreader 40; and (e) an array of solder balls (i.e., ball grid array) 50.

The substrate 10 has a front surface 10a and a back surface 10b, and whose front surface 10a is defined by design into a die mounting area 11 and a heat spreader attach area 12. The die mounting area 11 of the substrate 10 is used for mounting the semiconductor die 20 thereon in an upside-down manner (i.e., flip-chip). While the semiconductor die 20 is mounted in position, the heat spreader attach area 12 is coated with the adhesive layer 30 for mounting the heat spreader 40 thereon.

The heat spreader 40 includes an elevated overhead portion 41 and a support portion 42, and which is mounted over the front surface 10a of the substrate 10 in such a manner that the support portion 42 is adhered by means of the adhesive layer 30 to the heat spreader attach area 12 of the substrate 10, with its elevated overhead portion 41 coming into contact with the back side of the flip chip 20 (i.e., the inactive surface of the chip 20), preferably adhered by means of a thermally-conductive adhesive layer 21. Accordingly, the heat produced from the flip chip 20 during operation is transmitted to the heat spreader 40 and then dissipated via the heat spreader 40 to the atmosphere.

One shortcoming to the conventional FCBGA package depicted in FIG. 1, however, is that during fabrication or transporting, the heat spreader 40 would easily fall off position from the substrate 10, resulting in undesirable quality issue of the finished product. This problem is due to many causes, such as contaminant on the front surface 10a of the substrate 10, mismatch of CTE (Coefficient of Thermal Expansion) values between the heat spreader 40 and the substrate 10, thermal stress resulting in deformation, and crosswise shear stress (as indicated by Fx with arrow in FIG. 1) against the heat spreader 40 during transportation, and so on. When the heat spreader 40 falls off position from the substrate 10, the finished product of the FCBGA package undoubtedly regard as a defective one.

Related patents includes, for example, U.S. Pat. No. 5,459,368 entitled "Surface Acoustic Wave Device Mounted Module"; and U.S. Pat. No. 5,637,920 entitled "High Contact Density Ball Grid Array Package For Flip-chip"; to name just a few. However, these and other conventional patents provide no solutions to the aforementioned problems.

SUMMARY OF THE INVENTION

It is therefore an object of this invention to provide a new semiconductor packaging technology that allows the heat spreader in the semiconductor package to be more securely adhered in position on the substrate, for the purpose of allowing the finished product of the semiconductor package to be more assured in quality.

The semiconductor packaging technology of the present invention can be used for fabricating a semiconductor package, such as FCBGA (Flip-Chip Ball Grid Array) package with a heat spreader, and which is characterized by the provision of a plurality of recessed portions, either in the heat spreader attach area of the substrate or in the support portion of the heat spreader, or in both, so as to allow the adhesion to be filled into these recessed portions to form anchor structures to benefit the heat spreader against crosswise shear stress. Moreover, since the provision of these recessed portions allows an increase in contact area of the adhesive layer with the substrate and the heat spreader, it can enhance the adhesive strength and thereby the heat spreader to be more securely mounted in position on the substrate.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF THE PREFERRED EMBODIMENTS

Various preferred embodiments of the semiconductor package with heat spreader according to the invention are disclosed in full details in the following with reference to the accompanying drawings. In these preferred embodiments, the semiconductor package in accordance with the invention is referred to Flip Chip Ball Grid Array (FCBGA)-type package. However, it well be obvious to one of ordinary skill in the art that this invention may be practiced without these specific details. In other instances, well known methods, procedures, components, and circuits have not been described in detail as not to unnecessary obscure aspects of the present invention.

Figure 1:
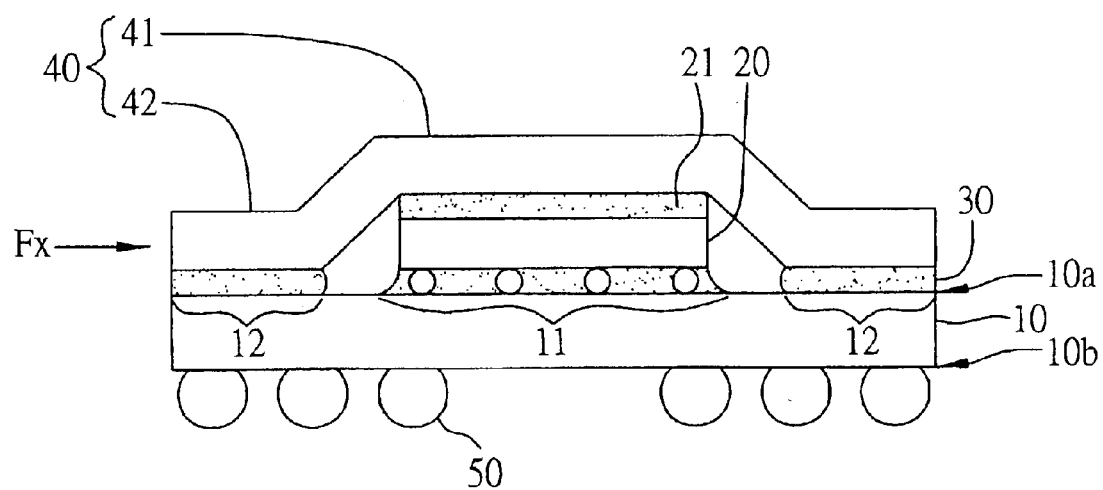
FIG. 1 (PRIOR ART) is a schematic diagram showing a sectional view of a conventional FCBGA-type of the semiconductor package with heat spreader.
Figure 2A:
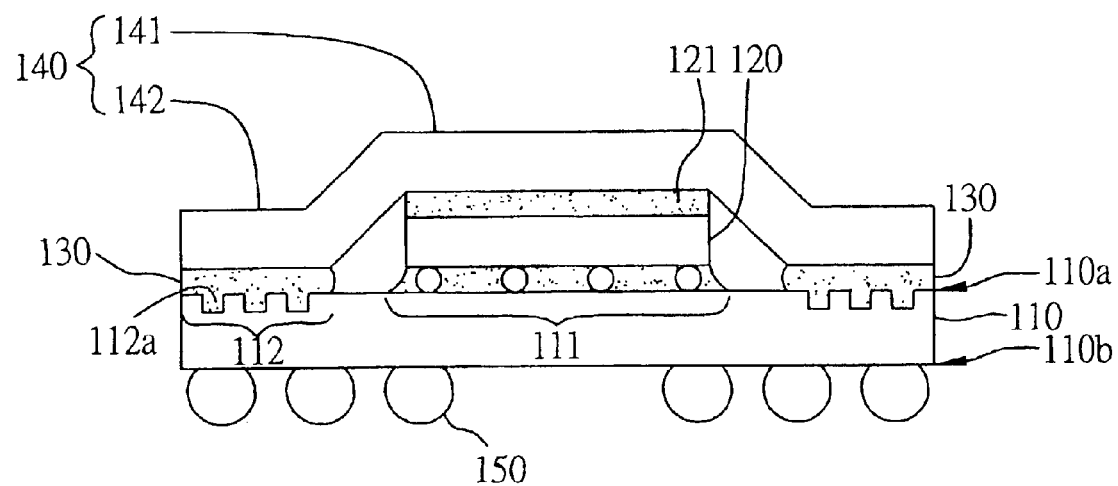
FIG. 2A is a schematic diagram showing a sectional view of a first preferred embodiment of the semiconductor package with heat spreader according to the invention.

FIG. 2A is a schematic diagram showing a sectional view of a first preferred embodiment of the semiconductor package with heat spreader according to the invention. As shown in FIG. 2A, the semiconductor package, such as a FCBGA package, is composed of the following components: (a) a substrate 110; (b) at least one semiconductor die 120; (c) an adhesive layer 130; (d) a heat spreader 140; and (e) an array of solder balls (i.e., balls grid array) 150.

The substrate 110 has a front surface 110a and a back surface 110b, and whose front surface 110a is defined by design into a die mounting area 111 and a heat spreader attach area 112 (note that the substrate 110 herein and below is shown schematically as one block, but in practice it may consist of various components, such as a core layer, a solder mask coated over its surface, a plurality of electrically conductive vias penetrating through the core layer, and so on, however, since these parts are irrelevant to the spirit of the invention, they are not specifically shown in the drawings. Additionally, FIGS. 2A–2C and all the ensuing drawings are simplified schematic diagrams to show only those parts related to the invention, and the shown parts are not depicted to actual scale, size and numbers, which can be arbitrary design choices in the actual implementation of the invention and layout of those parts may be more complex.).

Figure 2B:
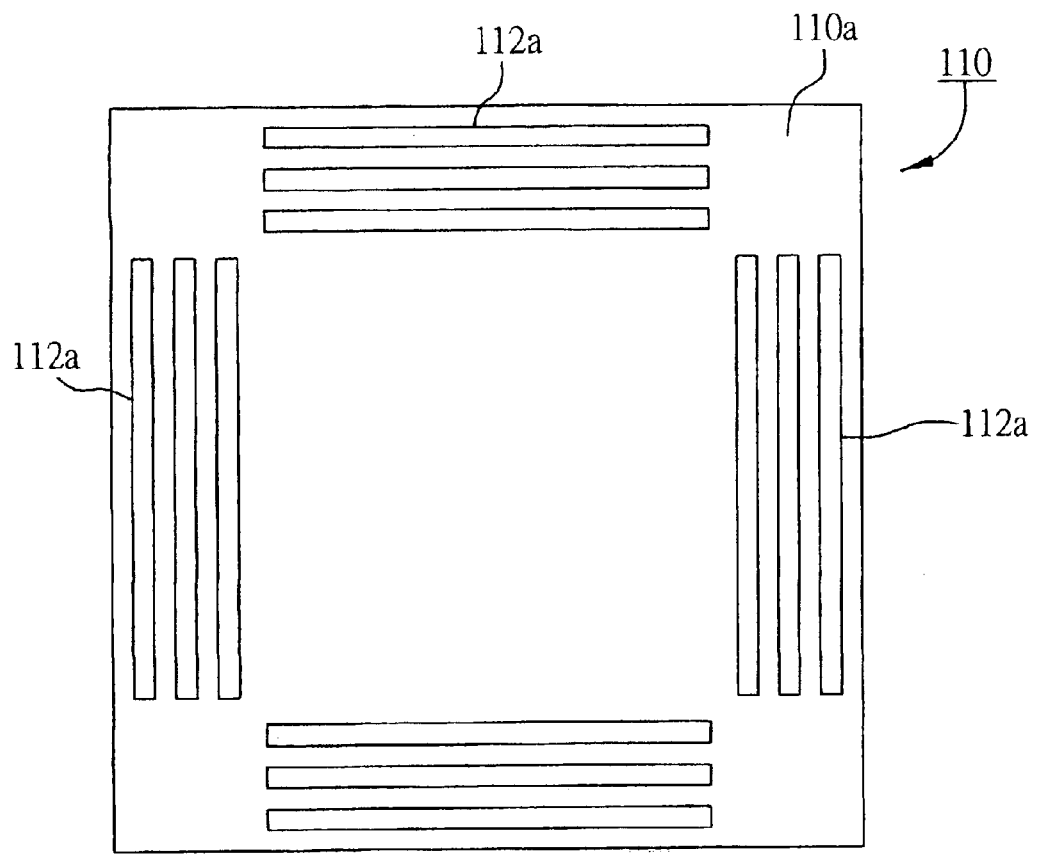
FIG. 2B is a schematic diagram showing a top view of the substrate utilized in the semiconductor package of FIG. 2A.
Figure 2C:
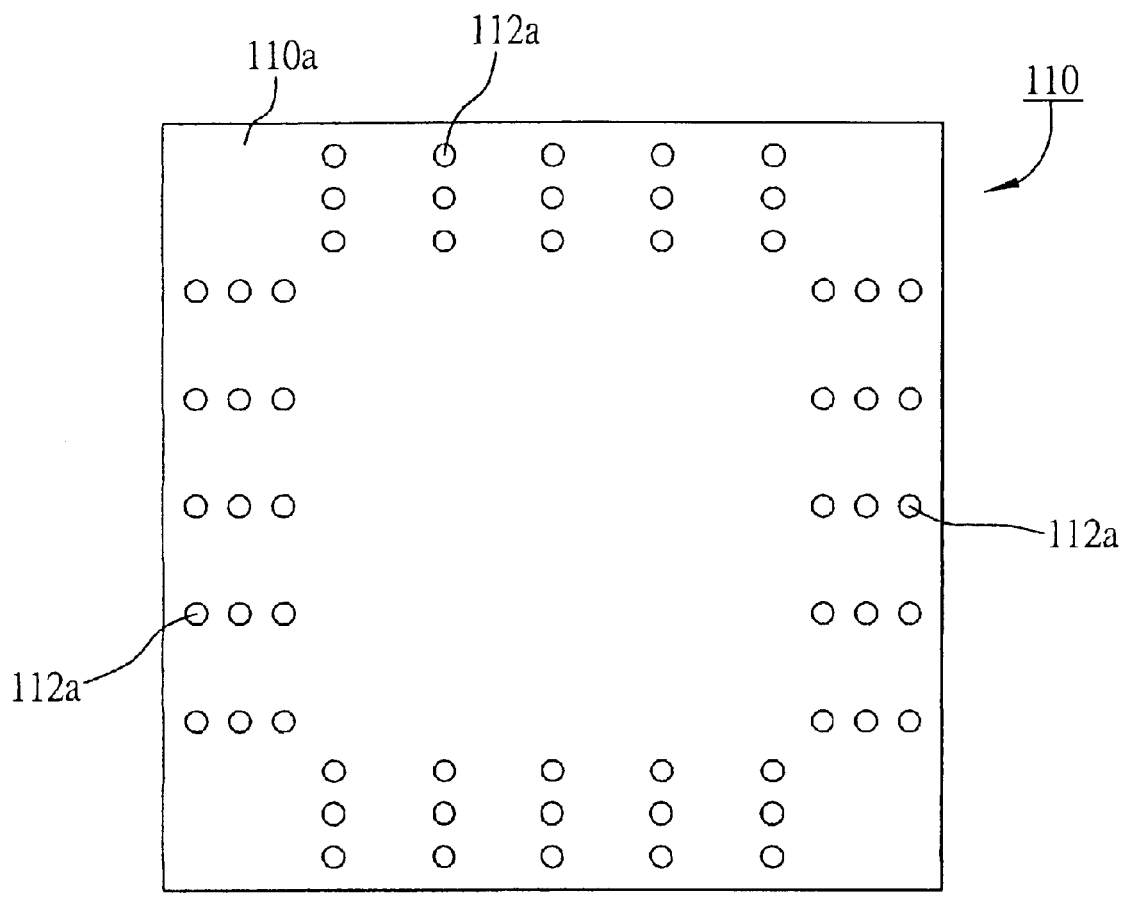
FIG. 2C is a schematic diagram showing a top view of another substrate utilized in the semiconductor package depicted to a first embodiment of the invention.
Figure 5A:
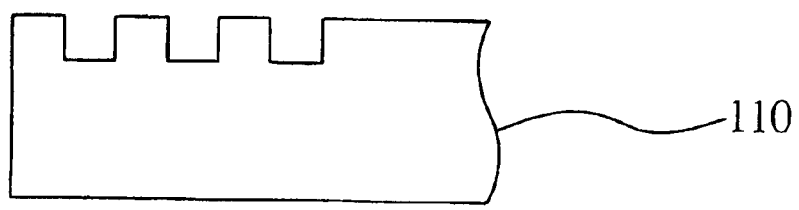
FIGS. 5A–5C are schematic diagrams showing three various different implementation of the recessed portions in the substrate utilized by the invention.
Figure 5B:
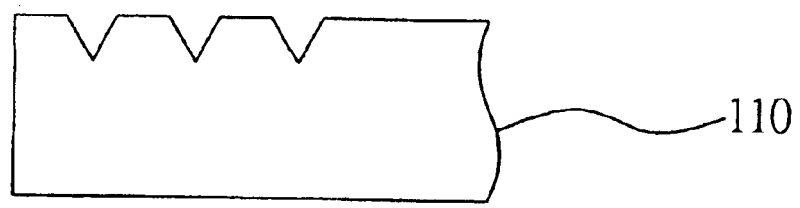
Figure 5C:
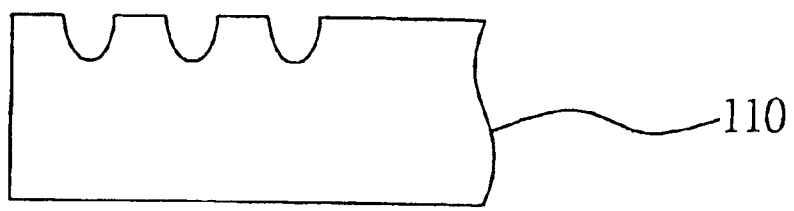

It is a characteristic feature of the first preferred embodiment of the invention that a plurality of recessed portions 112a are formed in the surface of the heat spreader attach area 112 of the substrate 110. The recessed portions 112a are preferably either elongated in length over the front surface 110a of the substrate 110 (i.e., elongated grooves 112a) as illustrated in FIG. 2B or formed as an array of holes thereon. (i.e., "holes array 112a" shown in FIG. 2C) to increase number of the recessed portions 112a of the substrate 110. The enlarged sectional view of the substrate 110, as respectively illustrated in FIG. 5A, FIG. 5B and FIG. 5C, significantly shows the recessed portions to be rectangular, triangular or semicircular shape in cross section. Beside these examples, the elongated grooves 112a or holes array 112a can also be formed in the support portion 142 of the heat spreader 140 (referred to a second preferred embodiment).

The die mounting area 111 of the substrate 110 is used for mounting the semiconductor chip 120 thereon in an upside down manner (i.e., flip chip). Since the flip chip technology being used herein is conventional technology and irrelevant to the scope of the invention, detailed description thereof will be omitted While the semiconductor chip 120 is mounted in position, an adhesive material is coated over the heat spreader attach area 112 of the substrate 110 to form an adhesive layer 130. During this process, the adhesive material would fill into the recessed portion 112a for anchoring.

The heat spreader 140 includes an elevated overhead portion 141 and a support portion 142, and which is mounted over the front surface 110a of the substrate 10 in such a manner that the support portion 142 is adhered by means of the adhesive layer 130 to the heat spreader attach area 112 of the substrate 110, with its elevated overhead portion 141 coming into contact with the back side of the flip chip 120 (i.e., the inactive surface of the chip 120), preferably adhered by means of a thermally-conductive adhesive layer 121. Accordingly, the heat produced from the flip chip 120 during operation is transmitted to the heat spreader 140 and then dissipated via the heat spreader 140 to the atmosphere.

As the FCBGA package has been finished, it can be seen from FIG. 2A that an adhesive material fills into the recessed portions 112a of the substrate 110 can form anchor structure to benefit the heat spreader 140 against crosswise shear stress. Moreover, since the provision of these recessed portions 112a allows an increase in the contact area between the substrate 110 and the adhesive layer 130, it can enhance the adhesive strength between the heat spreader 140 and the substrate 110, resulting in the heat spreader 140 to be more securely adhered in position on the substrate 110.

Figure 3:
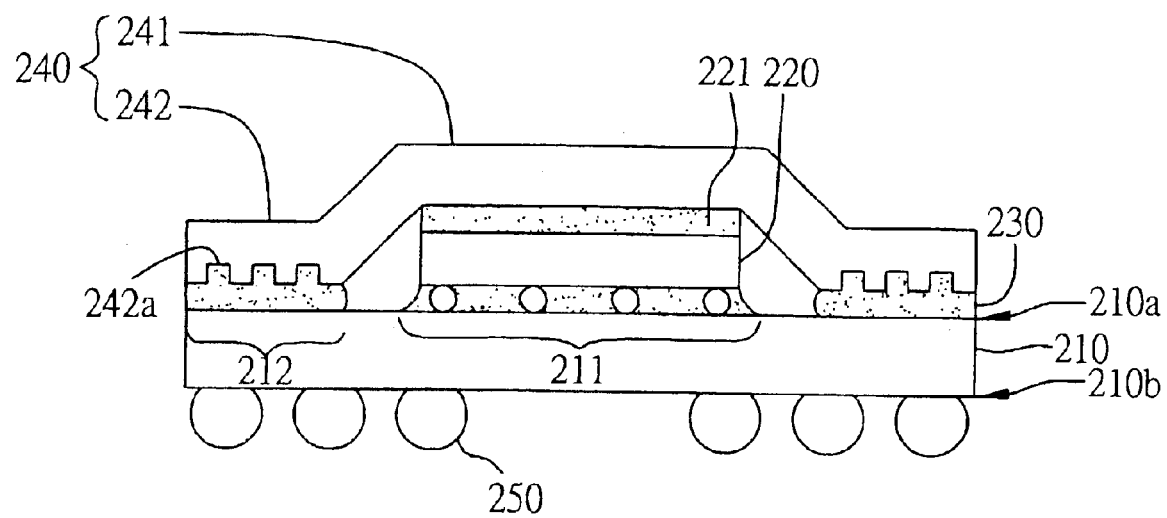
FIG. 3 is a schematic diagram showing a sectional view of a second preferred embodiment of the semiconductor package with heat spreader according to the invention.

Second Preferred Embodiment (FIG. 3)

FIG. 3 is a schematic diagram showing a sectional view of a second preferred embodiment of the semiconductor package with embedded heat spreader according to the invention. As shown, this FCBGA package is composed of the following components: (a) a substrate 210 having a front surface 210a and a back surface 210b, and whose front surface 210a is defined into a die mounting area 211 and a heat spreader attach area 212; (b) at least one semiconductor chip 220; (c) an adhesive layer 230; (d) a heat spreader 240 having an elevated overheat portion 241 and a support portion 242; and (e) an array of solder balls (i.e., ball grid array) 250.

The second preferred embodiment differs from the first one only in that the recessed portions (indicated here by the reference numeral 242a) are instead formed in the bottom surface of the support portion 242 that are mounted against the heat spreader attach area 212 of the substrate 210.

Figure 6A:
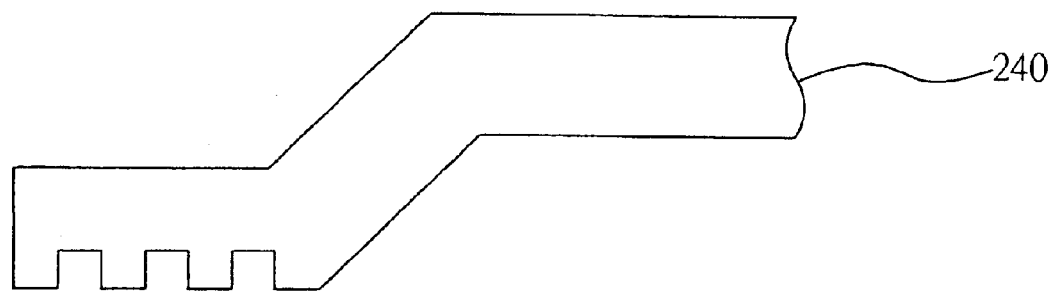
FIGS. 6A–6C are schematic diagrams showing three various different implementation of the recessed portions in the substrate utilized by the invention.
Figure 6B:
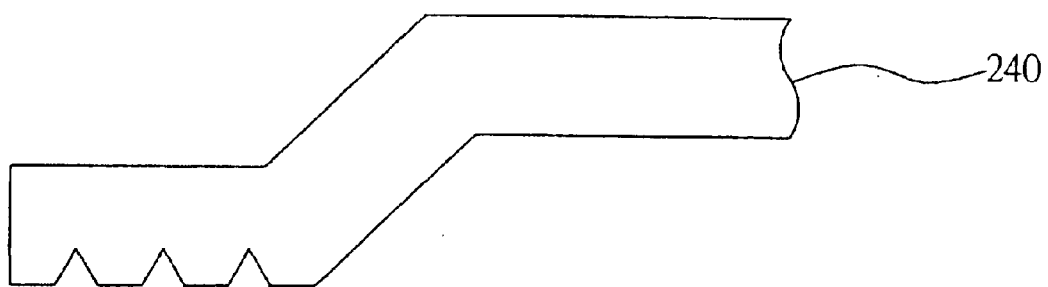
Figure 6C:
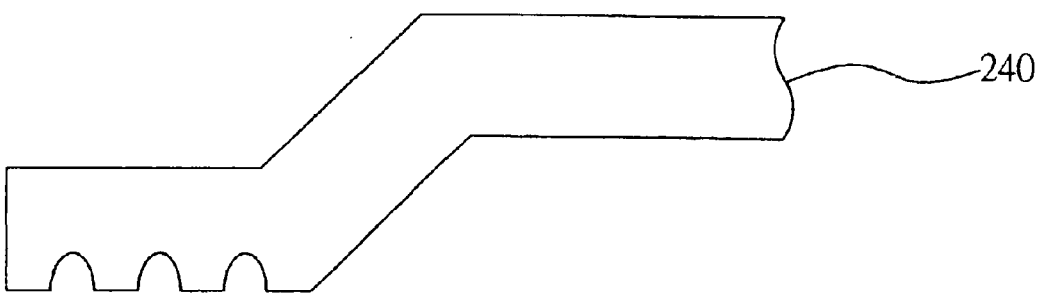

These recessed portions 242a can be rectangular, triangular, or semicircular shape in cross section, as respectively illustrated in FIG. 6A, FIG. 6B, and FIG. 6C. Beside these examples, various other cross-sectional shapes are feasible in performable scope of the invention.

As the FCBGA package is finished, it can be seen from FIG. 3 that the adhesive layer 230 filled into the recessed portions 242a in the support portion 242 of the heat spreader 240 can form anchor structure to benefit the heat spreader 240 against crosswise shear stress. Moreover, since the provision of these recessed portions 242a allows an increase in the contact area between the substrate 210 and the support portion 242 of the heat spreader 240, it can enhance the adhesive strength between the heat spreader 240 and the substrate 210, resulting in the heat spreader 240 to be more securely adhered in position on the substrate 210.

Figure 4:
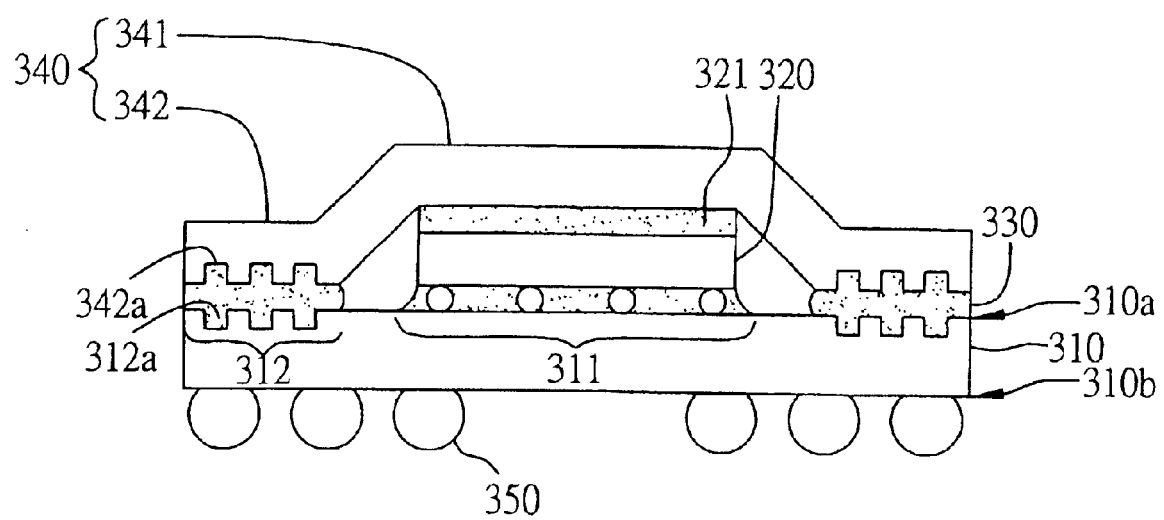
FIG. 4 is a schematic diagram showing a sectional view of a third preferred embodiment of the semiconductor package with heat spreader according to the invention.

Third Preferred Embodiment (FIG. 4)

FIG. 4 is a schematic diagram showing a sectional view of a third preferred embodiment of the semiconductor package with embedded heat spreader according to the invention. As shown, this FCBGA package is composed of the following components: (a) a substrate 310 having a front surface 310a and a back surface 310b, and whose front surface 310a is defined into a die mounting area 311 and a heat spreader attach area 312; (b) at least one semiconductor chip 320; (c) an adhesive layer 330; (d) a heat spreader 340 having an elevated overheat portion 341 and a support portion 342; and (e) an array of solder balls (i.e., ball grid array) 350.

The third preferred embodiment differs from the previous first and second embodiments only in that recessed portions 312a,342a are formed both in the heat-spreader mounting area 312 of the substrate 310 and in the bottom surface of the support portion 342 of the heat spreader 340. This provision can help secure the heat spreader 340 more firmly in position on the substrate 310 than the previous first and second embodiments.

Conclusion

In conclusion, the invention provides a semiconductor package with embedded heat spreader, which can be used for the fabrication of a semiconductor package, such as a FCBGA (Flip-Chip Ball Grid Array) package with heat spreader, and which is characterized by the provision of a plurality of recessed portions, either in the heat spreader attach area of the substrate, or in the support portion of the heat spreader, or in both, so as to allow the fill-in portions of the adhesive layer that are filled in these recessed portions to form anchor structure to benefit the heat spreader against crosswise shear stress. Moreover, since the provision of these recessed portions allows an increase in the contact area between the substrate and the heat spreader, it can enhance the adhesive strength to provide the heat spreader to be more securely adhered in position on the substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, which comprises:
   a substrate having a front surface and a back surface, and whose front surface is defined as a die mounting area and a heat spreader attach area, and wherein the heat spreader attach area is formed with a plurality of recessed portions;
   at least one semiconductor chip mounted on the die mounting area of the substrate;
   an adhesive layer, which is coated over the heat spreader attach area of the substrate and substantially fills in the recessed portions in the heat spreader attach area of the substrate; and
   a heat spreader having a support portion and an elevated overhead portion, wherein the support portion is adhered by means of the adhesive layer to the heat spreader attach area of the substrate, with the elevated overhead portion coming in contact with the semiconductor chip for the purpose of heat dissipation from the semiconductor chip.

2. The semiconductor package of claim 1, wherein the cross section of the recessed portions in the heat spreader attach area of the substrate are substantially triangularly-shaped.

3. The semiconductor package of claim 1, wherein the cross section of the recessed portions in the heat spreader attach area of the substrate are substantially rectangularly-shaped.

4. The semiconductor package of claim 1, wherein the cross section of the recessed portions in the heat spreader attach area are substantially semicircularly-shaped.

5. The semiconductor package of claim 1, wherein the recessed portions in the heat spreader attach area of the substrate are an array of holes thereon.

6. The semiconductor package of claim 1, wherein the support portion of the heat spreader is further formed with a plurality of recessed portions on the surface facing against the heat spreader attach area of the substrate, and these recessed portions are substantially filled in with the adhesive layer.

7. A semiconductor package, which comprises:
   a substrate having a front surface and a back surface, and whose front surface is defined as a die mounting area and a heat spreader attach area, wherein the heat spreader attach area is formed with a plurality of recessed portion;
   at least one semiconductor chip mounted on the die mounting area of the substrate;
   an adhesive layer, which is coated over the heat spreader attach area of the substrate; and
   a heat spreader having a support portion and an elevated overhead portion, wherein the bottom surface of the support portion is formed with a plurality of recessed portions, and wherein the support portion is adhered by means of the adhesive layer to the heat spreader attach area of the substrate, with the adhesive layer substantially filling in the recessed portions, and with the elevated overhead portion coming in contact with the semiconductor chip for the purpose of heat dissipation from the semiconductor chip.

8. The semiconductor package of claim 7, wherein the cross section of the recessed portions in the support portion of the heat spreader are substantially triangularly-shaped.

9. The semiconductor package of claim 7, wherein the cross section of the recessed portions in the support portion of the heat spreader are substantially rectangularly-shaped.

10. The semiconductor package of claim 7, wherein the cross section of the recessed portions in the support portion of the heat spreader are substantially semicircularly-shaped.

11. The semiconductor package of claim 7, wherein the recessed portions in the support portion of the heat spreader are an array of holes thereon.

12. The semiconductor package of claim 7, wherein the recessed portions are substantially filled in with the adhesive layer.

* * * * *